United States Patent [19]

Bergmann et al.

[11] 4,197,147
[45] Apr. 8, 1980

[54] METHOD OF MANUFACTURING AN INTEGRATED CIRCUIT INCLUDING AN ANALOG CIRCUIT AND AN I²L CIRCUIT UTILIZING STAGED DIFFUSION TECHNIQUES

[75] Inventors: Günther Bergmann, Blaustein-Arnegg; Hermann Clauss, Leingarten, both of Fed. Rep. of Germany

[73] Assignee: Licentia Patent-Verwaltungs-G.m.b.H, Frankfurt am Main, Fed. Rep. of Germany

[21] Appl. No.: 893,521

[22] Filed: Apr. 4, 1978

[30] Foreign Application Priority Data

Apr. 5, 1977 [DE] Fed. Rep. of Germany ....... 2715158

[51] Int. Cl.² ............... H01L 21/22; H01L 27/04; H01L 29/72
[52] U.S. Cl. ................... 148/175; 29/577 C; 29/578; 148/1.5; 148/187; 357/35; 357/36; 357/44; 357/46; 357/92
[58] Field of Search ........... 148/1.5, 175, 187; 29/577, 578; 357/35, 36, 44, 46, 92

[56] References Cited

U.S. PATENT DOCUMENTS

| 3,566,218 | 2/1971 | Widlar et al. ............... 148/187 X |
| 3,770,519 | 11/1973 | Wiedmann ..................... 148/175 |
| 3,810,123 | 5/1974 | Baitinger et al. ............. 357/46 X |
| 3,969,748 | 7/1976 | Horie et al. ................... 357/46 |
| 4,043,849 | 8/1977 | Kraft et al. ................. 148/175 X |
| 4,087,900 | 5/1978 | Yiannoulos ................. 148/187 X |

OTHER PUBLICATIONS

Jakits, V. O., "Integrierte Injektion Slogik . . . " Valvo Berichte, vol. XVIII, Book ½, pp. 215–226, Apr. 1974.
Berger et al., "Integrated Transistor . . . Variable-Current Amplification" I.B.M. Tech. Discl. Bull., vol. 15, No. 5, Oct. 1972, p. 1625.

*Primary Examiner*—R. Dean
*Assistant Examiner*—W. G. Saba
*Attorney, Agent, or Firm*—Spencer & Kaye

[57] ABSTRACT

A method of manufacturing an integrated circuit including an analog circuit and an I²L circuit which both contain NPN transistors on a P-type semiconductor chip in which the method includes an N+ diffusion step for producing a flat diffusion for certain NPN transistors having smaller penetration depth than N+ regions of the other NPN transistors for connection of an emitter electrode to the said certain NPN transistors.

5 Claims, 4 Drawing Figures

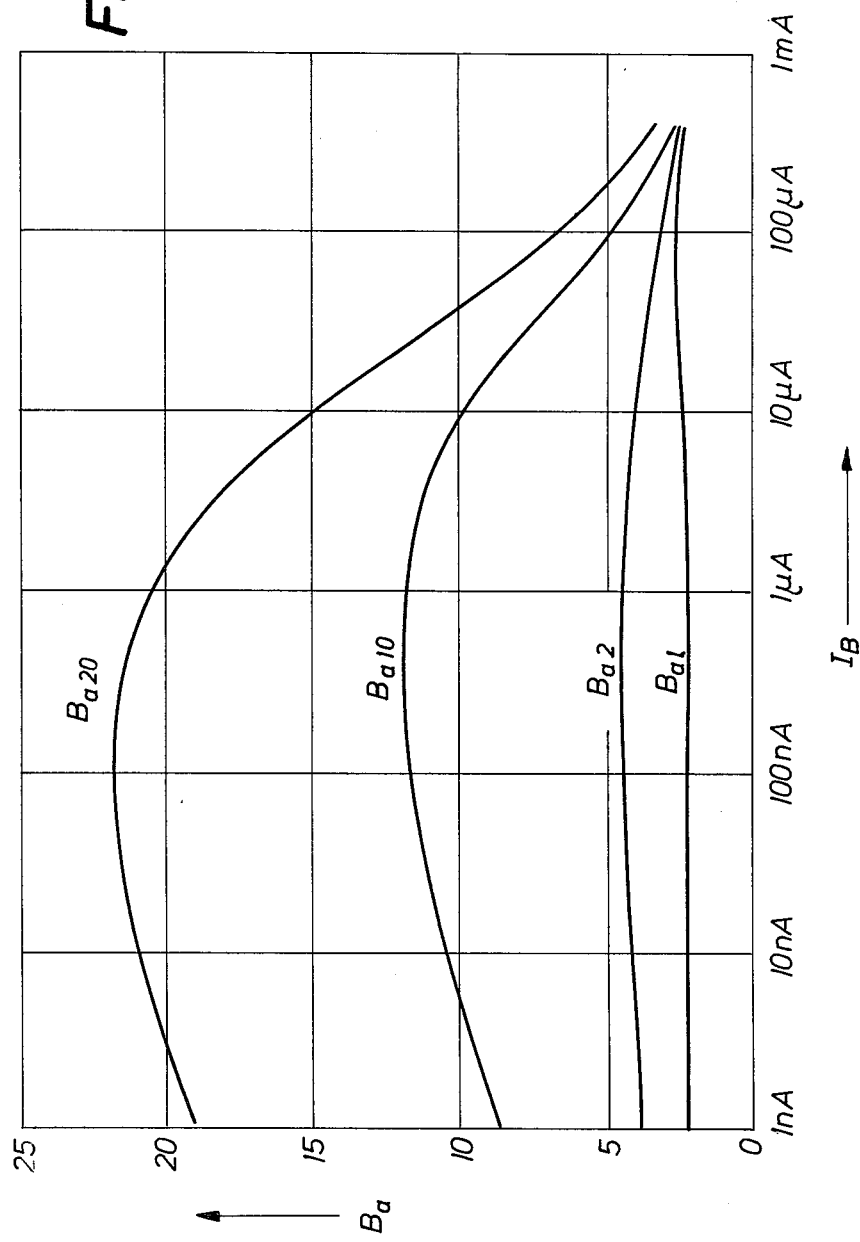

METHOD OF MANUFACTURING AN INTEGRATED CIRCUIT INCLUDING AN ANALOG CIRCUIT AND AN I²L CIRCUIT UTILIZING STAGED DIFFUSION TECHNIQUES

BACKGROUND OF THE INVENTION

The invention relates to a method of manufacturing an analog circuit integrated with an I²L circuit on a common semiconductor chip of the P-conductive type in the course of common technological process steps with vertical NPN switching transistors in the I²L circuit and with linear vertical NPN transistors in the analog circuit.

The manufacture of I²L circuits and bipolar analog circuits on a common semiconductor chip of the type mentioned above is known for example from the Valvo Reports, Volume XVIII, Book ½, pages 215–226. In the integrated injection logic circuit (I²L) lateral PNP transistors, also called injectors, are used as current sources for vertical NPN switching transistors. An I²L-logic element works with very small power consumption and needs little crystal surface so that high packing densities can be achieved.

Bipolar analog circuits contain a vertical NPN transistor which is operated, however, in contrast to the NPN switching transistor of the I²L circuit, in the reverse direction. Thus generally with an I²L circuit built up on a P-substrate, N+ regions diffused in the P-region, serving as the base, are used as collectors and the corresponding N+ regions of bipolar analog circuit are used as emitters.

When combining circuits on a common semiconductor chip both circuits can be manufactured in a common process. Only one further step is needed for manufacturing deep N+ regions for decoupling of adjacent I²L gates.

In I²L logic circuits, the binary potential conditions are below 1 V. The maximum collector voltage of their NPN switching transistors is approximately 2 to 5 V caused by a desired high operating frequency and an upward current amplification factor of approximately 4. However, in order to apply a fairly high switching power for analog circuits, supply voltages of about 30 V and more are often necessary. For this, it is known to apply epitaxial layers having a high specific resistance (1 to 3 Ω cm) and large thicknesses (10 to 15 μm) on to the substrate. However, the current amplification of the upwardly operated NPN switching transistors required for I²L circuits cannot be carried out without problems.

SUMMARY OF THE INVENTION

It is an object of the invention to overcome the disadvantage of the low breakdown voltage of the linear transistors occurring when combining bipolar circuits with digital circuits in I²L technology and to improve the properties of the combined circuit.

According to the invention, there is provided a method of manufacturing an integrated circuit including an analog circuit and an I²L circuit which both contain NPN transistors on a P-type semiconductor chip, said method comprising forming the majority of the integrated circuit by common technological methods and completing certain NPN transistors by flat diffusion of N+ regions having a smaller penetration depth than N+ regions of the other NPN transistors for connection of an emitter electrode to the associated said certain NPN transistors.

Further according to the invention, there is provided a method of manufacturing at least one analog circuit integrated with at least one I²L circuit on a common semiconductor wafer of the P-conductive type during the course of common technological process steps with vertical NPN switching transistors in the I²L circuit and with linear vertical NPN transistors in the analog circuit, characterised by a further process step producing N+ regions which are flat for certain NPN transistors in contrast to the penetration depths of the N+ regions of the collectors of the I²L circuit and which are provided in order to connect an emitter electrode respectively of a certain NPN transistor.

BRIEF DESCRIPTION OF THE DRAWINGS

The invention will now be described in greater detail, by way of example with reference to the drawings, in which:

FIG. 4 shows upward current amplification factors of vertical NPN switching transistors of the I²L circuit manufactured according to the method in accordance with the invention.

DESCRIPTION OF THE PREFERRED EMBODIMENTS

Owing to the additional process step, it is now possible to substantially increase the collector base breakdown voltage and the collector emitter breakdown voltage of certain linear vertical NPN transistors of the bipolar circuit. Thus the following values were measured at an embodiment.

$U_{CBo} = 65-75$ V
$U_{Ceo} = 35-40$ V

The additional process step is carried out in an advantageous manner subsequent to the process step for producing the N+ regions 711, 712 and 713 provided as collectors of the NPN switching transistor of the I²L circuit. Thus it is a question of a process step to be incorporated into the standard process for manufacturing combined I²L circuits and bipolar circuits in a simple manner.

If during the additional process step the flat N+ diffusion is carried out only partially in these regions which are subjected to the usual N+ doping and the collector regions in the I²L circuit are assigned to vertical NPN switching transistors and in the analog circuits emitter regions are assigned to vertical NPN transistors, then vertical NPN switching transistors are obtained in the I²L circuit and in the bipolar circuit linear vertical NPN transistors are obtained having a particularly high current amplification factor.

Figure 1:
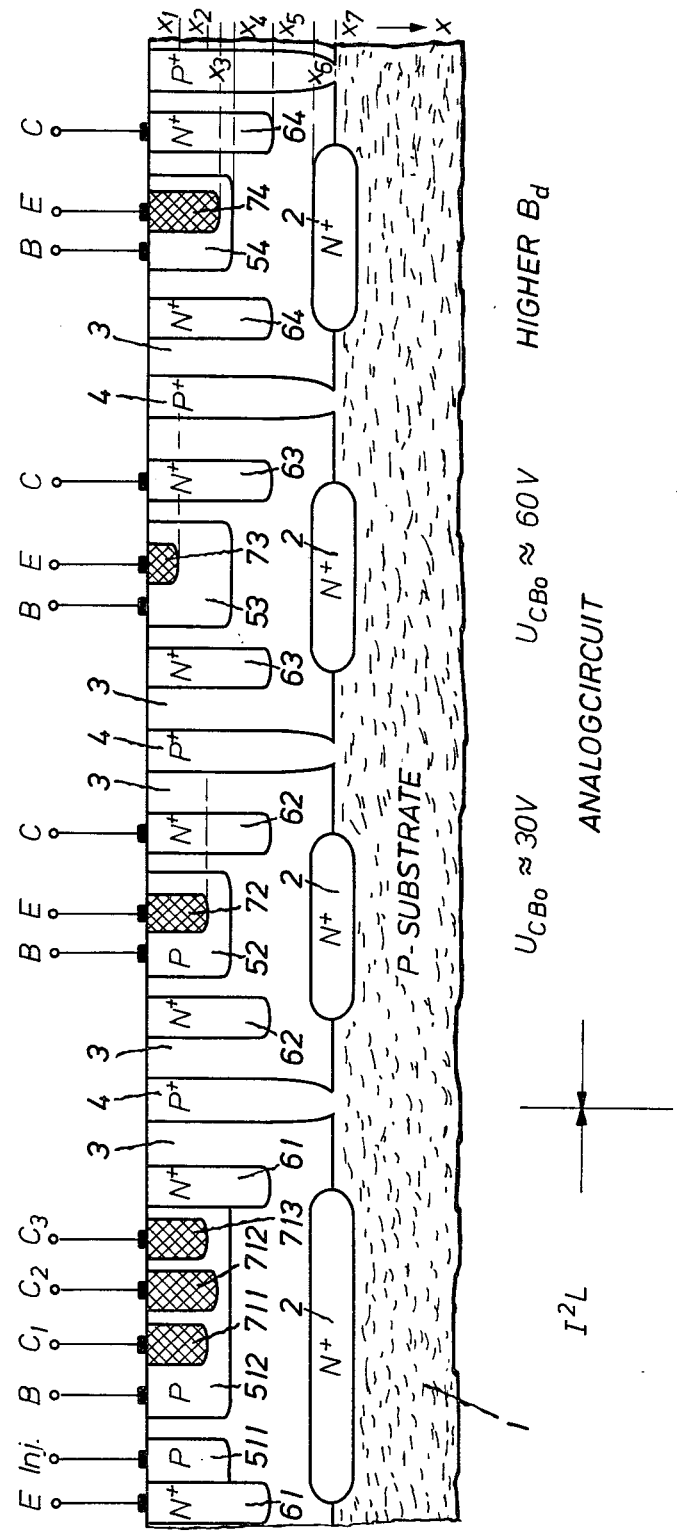
FIG. 1 shows a cross-section of a semiconductor chip manufactured according to the method in accordance with the invention and having a combined I²L and an analog circuit part.

Referring now to the drawings, in FIG. 1 a cross-section through a semi-conductor wafer of the P-type (P-substrate 1) is shown on which can be seen an I²L circuit for a digital circuit part, and for an analog circuit part a linear transistor with low blocking voltage (for example $U_{CBo} \approx 30$ V) of the usual type of manufacture and a linear transistor manufactured in accordance with the method according to the invention having a high blocking voltage (for example $U_{CBo} \approx 60$ V).

In the so-called "Standard" method of manufacturing combined digital and analog circuits, essentially the following process steps are usual:

1. Diffusing of N+ regions 2 into a P-substrate 1 of the semiconductor chip which later form buried layers.

2. Growth of an epitaxial layer 3 of the N-type onto the P-substrate.

3. Diffusion of deep P+ regions 4 which reach down to the P-substrate 1 and separate the individual circuit parts electrically.

4. Diffusion of P regions 511 and 512 for injectors and base regions of the I²L circuits and of P-regions 52, 53 and 54 for base regions of linear transistors of the analog circuits.

5. Diffusion of deep N+ regions 61 for separating adjacent I²L circuits and for connecting their emitters normally lying at reference potential and N+ regions 62, 63 and 64 for the collectors of the linear transistors of the analog circuits.

6. Diffusion of N+ regions 711, 712, 713 into the base regions of the I²L circuits for I²L collectors and of N+ regions 72 for the emitters of linear transistors of the analog circuits.

7. Opening of the contact windows for connecting the semiconductor regions to metallic conductive tracks.

8. Applying the conductive tracks inclusive of contacting.

The step positions 4 and 5 can be exchanged in their sequence if very deep N+ regions 61, 62, 63, 64 have to be produced.

With this method of manufacture, vertical NPN switching transistors arise in the I²L circuits and linear vertical NPN transistors in the analog circuit, their emitter connections being designated E, their base connections B and their collector connections C or $C_1$, $C_2$ and $C_3$. The NPN transistor shown in FIG. 1 in the I²L part has three separate collectors $C_1$, $C_2$ and $C_3$ in a common P-base region and is designated as a multiple collector transistor.

The method in accordance with the invention is characterised by a further process step which produces flat N+ regions 73 for certain NPN transistors which serve as emitters of a defined NPN transistor. By a flat N+ region is meant a N+ region 73 of the sort of penetration depth, which does not reach as deep into the base region 53 in comparison to the penetration depth of the N+ regions 711 and 713 of the collectors of the I²L circuit.

This additional process step can be carried out in an advantageous manner after the sixth process step which serves to produce the N+ regions 711, 712 713 and 72. Thus N+ doped materials, preferably phosphorous are introduced, having the desired penetration depth into the crystal. Since no further processes which substantially change the distribution of the materials follow this process the desired electrical parameters can easily be set. These defined transistors manufactured with flat emitter diffusion are characterised by a substantially higher voltage resistance. This will be explained in greater detail together with an embodiment.

The combined integrated circuit manufactured according to the method in accordance with the invention has the following data:

| | |
|---|---|
| Conductivity of the P-substrate 1–10 Ω cm | |
| Thickness of the epitaxial layer | $x_7 \approx 10$ μm |
| Penetration depth of the deep N+ regions 61, 62 and 63 | $x_5 \approx 7$ μm |
| Penetration depth of the injector and base regions 511, 52 and 53 | $x_4 \approx 3,2$ μm |
| Penetration depth of the normal N+ regions 711, 713 and 72 in the base regions 512 and 52 | $x_2 \approx 2,4$ μm |
| Penetration depth of the flat N+ region 73 in base region 53 | $x_1 \approx 2$ μm |
| Spacing between the buried N+ layer 2 and the base regions 512, 52 and 53 | $x_6-x_4 \approx 3,94$ μm |
| Impurity concentration in the N-epitaxial layer | $5 \cdot 10^{15}$ cm$^{-3}$ |
| Sheet resistance of the P-base regions | 150–200 Ω/□ |

The following electrical values were determined on linear transistors of the analog circuit part:

1. The usual linear NPN transistors having a normal N+ emitter diffusion corresponding to the N+ region 72 in FIG. 1.

$U_{CBo} \approx 30$ V (blocking voltage between C and B with an open E)

$U_{CEO} \approx 15$ V (blocking voltage between C and E with open B)

$B_d \approx 400$ (downward current amplifications factor $I_C/I_B$ with $I_C = 1$ mA $f_T \approx 400$ MHz (transit frequency with $I_C = 1$ mA)

2. Linear vertical NPN transistors having a flat N+ emitter diffusion corresponding to N+ region 73 and manufactured according to the method in accordance with the invention in FIG. 1 under the same conditions show the following values:

$U_{CBo} \approx 65$–75 V $U_{CEo} \approx 35$–40 V $B_d \approx 15 \ldots 30$ $f_T \approx 100$ MHz The breakdown voltage of the transistors manufactured in accordance with the method according to the invention is consequently more than twice as high as that of the linear transistors according to the usual method of manufacture. As a result, in an advantageous manner, gas discharge displays can be triggered with the voltage resistant transistors for example. Since these display units only require a small amount of current and are triggered quasi-statically, the low downward current amplification factor $B_d$ and the low transit frequency $f_T$ are unimportant.

Figure 2:
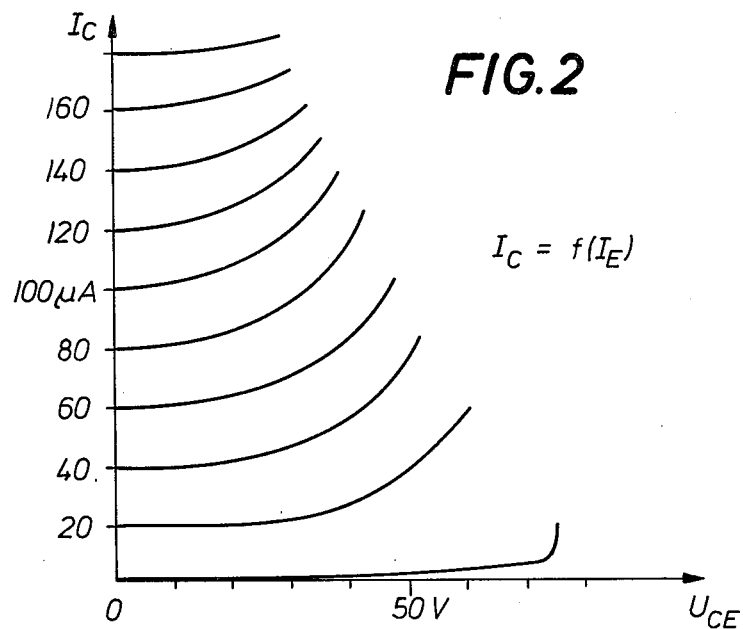
FIG. 2 shows output characteristics for a linear NPN transistor of the analog circuit part in common base configuration and manufactured according to the method in accordance with the invention.

FIG. 2 shows the output characteristics $I_C = f(U_{CE})$ of a voltage resistant transistor in common base configuration and manufactured according to the method in accordance with the invention. The base current was increased in steps of 20 μA. Normally the collector current $I_C$ is approximately equal to the emitter current $I_E$. The increase in the collector current with an increase in voltage $U_{CE}$ between the collector and the emitter of the transistor is reversible and not caused by enlarging the collector junction up to the emitter (punch-through effect).

In further refinement of the method in accordance with the invention, the flat N+ diffusion is partially carried out in those regions which are subjected to the usual N+ doping, and which are the I²L circuit collector regions assigned to vertical NPN switching transistors and the emitter regions in the analog circuits assigned to the linear vertical NPN transistors.

This type of embodiment in the I²L circuit is shown in FIG. 1. Here the flat emitter diffusion was also used on a region which is assigned to the collector region 712 of the collector C$_2$. By means of this additional flat diffusion, which takes place at the same time, i.e. with the same masking step as the flat diffusion for the emitter region 73, the penetration depth of the collector region into the base region 512 of the I$^2$L circuit is greater and vertical switching transistors are formed having a particularly high upward current amplification factor B$_a$.

Figure 3:
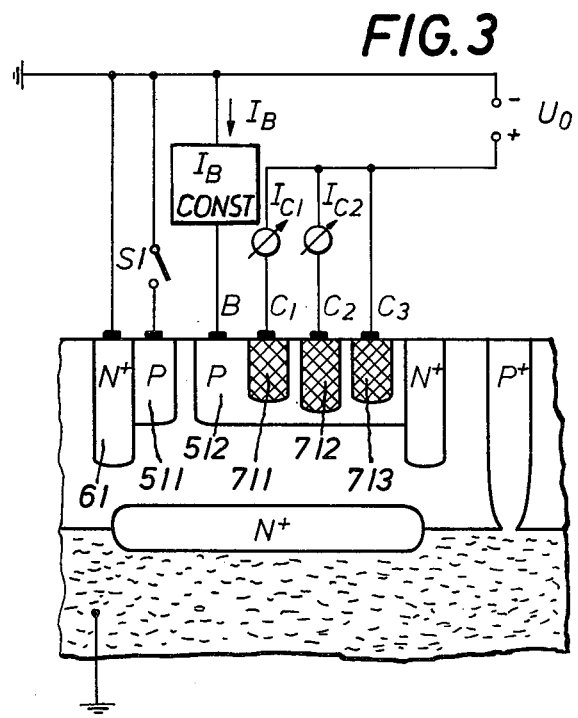
FIG. 3 shows a circuit for measuring some upward current amplification factors of an NPN-switching transistor of an I²L gate.

A measuring circuit for the I$^2$L circuit shown in FIG. 1 for measuring the upward current amplification factor B$_a$ is shown in FIG. 3. The designations correspond to those of FIG. 1. As with measurements on I$^2$L circuits, the injector is connected to the emitter of the vertical NPN switching transistor lying at reference potential by a switch S1 and the collector currents, for example I$_{C1}$, I$_{C2}$ of the collectors C$_1$, C$_2$ which are at reference potential via an operating voltage source U$_o$=0.5 V are brought into a relationship to the base current I$_B$ impressed into the base B. FIG. 4 shows the upward current amplificaton factors determined depending on the base current I$_B$ B$_{a10}$=I$_{C1}$/I$_B$ for the open switch S1
B$_{a20}$=I$_{C2}$/I$_B$ for the open switch S1
B$_{a1}$=I$_{C1}$/I$_B$ for the closed switch S1
B$_{a2}$=I$_{C2}$/I$_B$ for the closed switch S1

With a closed switch (characteristics B$_{a1}$, B$_{a2}$) the so-called effective upward current amplification factor is measured. It is a measure of noise margin of the circuit. It is determined in part by the spacing base-injector and can be influenced by the dimensions of masks, (layout).

The NPN switching transistor arising because of the additional process step in accordance with the method according to the invention, having the collector region 712, has an approximately twice as large a current amplification factor (B$_{a20}$≈20) in the embodiment as the remaining NPN switching transistors of the I$^2$L circuit. The fall off in the current amplification factors towards smaller base currents is only small in an advantageous manner. This is above all a result of the small spacing of the P-injector region 511 from the P-base region 512 and thus owing to the small base width (≈1.8 μm) of the lateral PNP transistor formed by these regions and the N-epitaxial layer here between.

The additional flat emitter diffusion in the certain transistors can be used advantageously on linear transistors of the analog circuit which are subjected to the usual N$^+$ doping. Then, as shown on the right-hand side in FIG. 1, linear transistors are formed having N$^+$ penetration depths of their emitter region 74 as in the vertical NPN switching transistor with the collector region 712 i.e. with N$^+$ penetration depths of >2.4 μm. These linear transistors of the analog circuit, manufactured with additional emitter diffusion also show a substantially higher downward current amplification factor B$_d$ relative to linear transistors of conventional manufacture and for certain applications where it is not a question of high blocking voltage of the relevant transistor, can be very desireable.

It will be understood that the above description of the present invention is susceptible to various modifications, changes and adaptions.

What is claimed is:

1. In a method of manufacturing a monolithic integrated circuit having at least one analog circuit portion, including a linear vertical NPN transistor, and at least one I$^2$L circuit portion, including vertical NPN switching transistors, on a common semiconductor substrate wafer of P-type conductivity including the steps of
diffusing N$^+$-type conductivity regions into selected portions of the surface of a P-type conductivity substrate, which regions form buried layers in the finished integrated circuit;
depositing an epitaxial layer of N-type conductivity on said surface of said substrate;
forming deep P$^+$-type conductivity regions which extend from the surface of said epitaxial layer down to said surface of said substrate to electrically isolate the individual circuit portions from one another;
simultaneously diffusing P-type conductivity regions into selected portions of the surface of said epitaxial layer to form the injectors and the transistor base regions of the I$^2$L circuits and the base regions of the linear transistors of the analog circuits; and
producing N$^+$-type conductivity regions in said base regions of the I$^2$L circuit portions to form the collectors of the NPN switching transistors of the I$^2$L circuits, and in the base regions of the analog circuit portions to form the emitters of the NPN linear transistors of the analog circuits; the improvement wherein said step of producing N$^+$-type conductivity regions includes forming the N$^+$-type conductivity emitter regions of at least one of the linear transistors of an analog circuit so that it is flat relative to the penetration depth of the N$^+$-type conductivity collector regions of the I$^2$L circuits.

2. The method defined in claim 1 wherein said step of producing N$^+$-type conductivity regions comprises simultaneously diffusing the N$^+$-type conductivity regions for the collectors of the I$^2$L circuits and for the emitter regions of only those linear transistors of the analog circuits which are to have an emitter penetration depth at least equal to that of the penetration depth of said collectors of the I$^2$L circuit; and thereafter producing N$^+$-type conductivity emitter regions which are flat relative to said penetration depth of said collector of the I$^2$L circuits for the remainder of the linear transistors of said analog circuits.

3. The method defined in claim 2 wherein said step of producing N$^+$-type conductivity regions which are flat is carried out by an additional diffusion step wherein an N-type impurity is diffused into a portion of the associated base region.

4. The method defined in claim 3 wherein during said additional diffusion step said N-type impurity is additionally diffused into only some of the previously formed collector regions for the I$^2$L circuits and emitter regions for the linear transistors of the analog circuits whereby the penetration depth of same is increased.

5. The method defined in claim 3 wherein said N-type impurity is diffused into a portion of the associated base region of only those linear transistors which had not previously been provided with an emitter region.

* * * * *